United States Patent
Saettone et al.

(10) Patent No.: US 12,262,640 B2
(45) Date of Patent: Mar. 25, 2025

(54) PIEZOELECTRIC DEVICE COMPRISING A MEMBRANE COMPRISING FIBRES OF A POLYHYDROXYALKANOATE

(71) Applicant: BIO-ON S.P.A., San Giorgio di Piano (IT)

(72) Inventors: Paolo Saettone, San Giorgio di Piano (IT); Gianluca Generali, San Giorgio di Piano (IT); Luana Persano, Cavallino (IT); Andrea Camposeo, Cavallino (IT); Dario Pisignano, Cavallino (IT); Mario Cifelli, San Giorgio di Piano (IT); Ilaria Monaco, San Giorgio di Piano (IT); Mirko Maturi, Bologna (IT); Mauro Comes Franchini, San Giorgio di Piano (IT)

(73) Assignee: BIO ON S.P.A., Turin (IT)

( * ) Notice: Subject to any disclaimer, the term of this patent is extended or adjusted under 35 U.S.C. 154(b) by 860 days.

(21) Appl. No.: 17/418,043

(22) PCT Filed: Dec. 27, 2018

(86) PCT No.: PCT/IB2018/060643
§ 371 (c)(1),
(2) Date: Jun. 24, 2021

(87) PCT Pub. No.: WO2020/136420
PCT Pub. Date: Jul. 2, 2020

(65) Prior Publication Data
US 2022/0085273 A1 Mar. 17, 2022

(51) Int. Cl.
*H01L 41/18* (2006.01)
*C08G 63/06* (2006.01)
(Continued)

(52) U.S. Cl.
CPC .......... *H10N 30/852* (2023.02); *C08G 63/06* (2013.01); *C08K 3/22* (2013.01); *C08K 5/09* (2013.01);
(Continued)

(58) Field of Classification Search
CPC .......................... H10N 30/852; H10N 30/702
See application file for complete search history.

(56) References Cited

U.S. PATENT DOCUMENTS

| | | | |
|---|---|---|---|
| 11,896,741 B2* | 2/2024 | Rabolt | A61L 31/14 |
| 2011/0117617 A1* | 5/2011 | Liu | C12P 7/625 |
| | | | 435/146 |

(Continued)

FOREIGN PATENT DOCUMENTS

KR 20110120250 A 11/2011

OTHER PUBLICATIONS

C.S.K. Reddy et al. "Polyhydroxyalkanoates: an overview", 2003, vol. 87, No. 2, p. 137-146, Bioresource Technology Retrieved from the Internet: URL:http://dx.doi.org/10.1016/S0960-8524(02)00212-2, XP002489595.

(Continued)

*Primary Examiner* — Bryan P Gordon
(74) *Attorney, Agent, or Firm* — CANTOR COLBURN LLP

(57) ABSTRACT

A piezoelectric device includes a membrane having fibres of a polyhydroxyalkanoate (PHA), having average diameter between 100 nm and 2000 nm, and at least one oxide having piezoelectric properties in a subdivided form having at least one average size between 1 nm and 100 nm. Preferably, the PHA fibres are produced by electrospinning. Advantageously, demonstrating good piezoelectric properties and considering that the piezoelectric device includes PHA, a biodegradable and biocompatible material, the device can be (Continued)

used in biological systems, for example in flexible microactuator systems for drug delivery and in the engineering of biological tissues (such as, for example, in pacemaker devices).

7 Claims, 1 Drawing Sheet

(51) Int. Cl.
| | |
|---|---|
| *C08K 3/22* | (2006.01) |
| *C08K 5/09* | (2006.01) |
| *C08K 9/02* | (2006.01) |
| *D01F 1/10* | (2006.01) |
| *D01F 6/62* | (2006.01) |
| *H10N 30/00* | (2023.01) |
| *H10N 30/092* | (2023.01) |
| *H10N 30/85* | (2023.01) |

(52) U.S. Cl.
CPC ............... *C08K 9/02* (2013.01); *D01F 1/10* (2013.01); *D01F 6/625* (2013.01); *H10N 30/092* (2023.02); *H10N 30/702* (2024.05); *C08K 2003/2206* (2013.01); *C08K 2003/2237* (2013.01)

(56) References Cited

U.S. PATENT DOCUMENTS

| | | | | |
|---|---|---|---|---|
| 2014/0272397 A1* | 9/2014 | Kim | ............... | H10N 30/092 |
| | | | | 117/64 |
| 2015/0001518 A1* | 1/2015 | Capelli | ............. | H10K 50/11 |
| | | | | 257/40 |
| 2020/0023408 A1* | 1/2020 | Miar | ............... | B05D 7/24 |

OTHER PUBLICATIONS

International Search Report issued Sep. 13, 2019 re: Application No. PCT/IB2018/060643, pp. 1-4, citing: US 2014/0272397 A1, KR 2011 0120250 A, C.S.K. Reddy et al. "Polyhydroxyalkanoate . . . " and Y. Ke et al. "Reactive blends . . . ".

Written Opinion issued Sep. 13, 2019 re: Application No. PCT/IB2018/060643, pp. 1-5, citing: US 2014/0272397 A1, KR 2011 0120250 A, C.S.K. Reddy et al. "Polyhydroxyalkanoate . . . " and Y. Ke et al. "Reactive blends . . . ".

Y. Ke et al. "Reactive blends based on polyhydroxyalkanoates: Preparation and biomedical application", Materials Science and Engineering C, Elsevier Science S.A, Apr. 7, 2016, vol. 70, pp. 1107-1119, XP029773544.

* cited by examiner

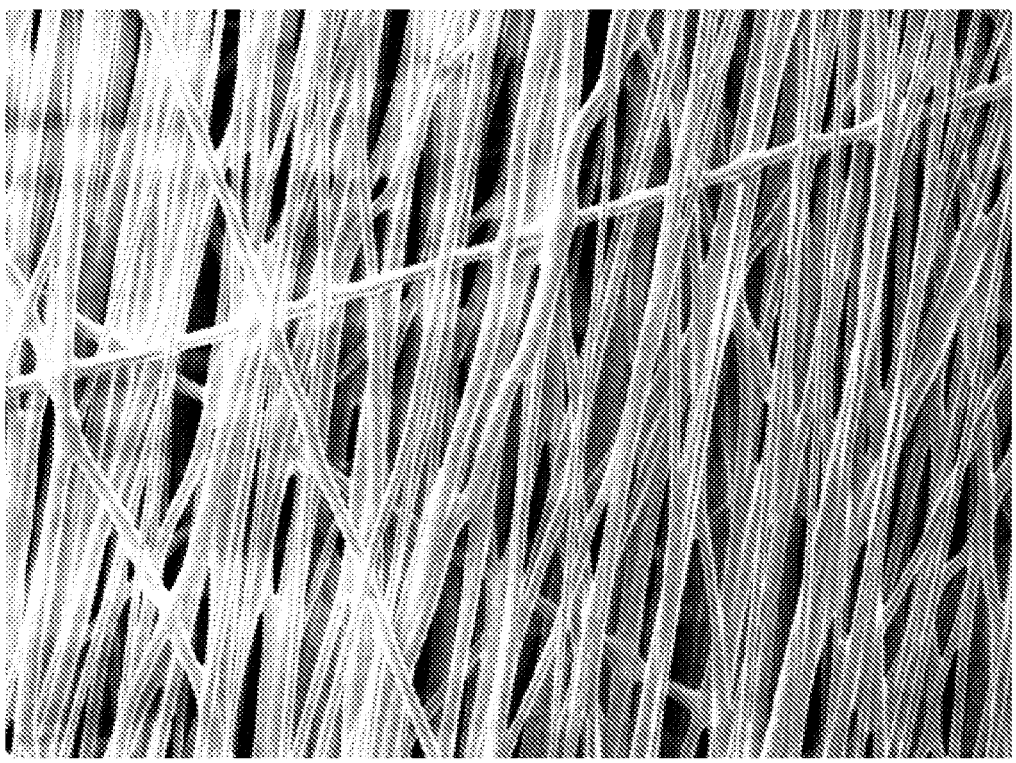

PIEZOELECTRIC DEVICE COMPRISING A MEMBRANE COMPRISING FIBRES OF A POLYHYDROXYALKANOATE

TECHNICAL FIELD

The present disclosure relates to a piezoelectric device. In particular, the present disclosure relates to a piezoelectric device comprising a membrane comprising fibres of a polyhydroxyalkanoate (PHA) and at least one oxide having piezoelectric properties.

BACKGROUND

It is well known that piezoelectricity is a physical phenomenon that originates from an electrical polarization on opposite faces of crystals subjected to traction or compression in certain directions (direct piezoelectric effect). There is also the so-called reverse piezoelectric effect (Lippmann effect), which derives from the compression or dilation of the crystal lattice in given directions, when a potential difference is applied between two faces of the crystal itself.

Piezoelectricity is manifested in most of the anisotropic crystals lacking a centre of symmetry.

The materials with piezoelectric properties can be of both natural and artificial origin. In both cases, the piezoelectric properties of the material derive from the decentralized position of the central atom in the crystalline structure. In fact, if a crystal with symmetrical structure is subjected to pressure, it does not develop an electric charge because it does not have an electric dipole.

Naturally piezoelectric materials are for example quartz, tourmalines, Rochelle salts (sodium and potassium tartrate), lithium titanate, langasite (lanthanum-gallium silicate), lithium niobate and zinc oxides.

Piezoelectric materials are therefore defined as those materials capable of producing and accumulating electrical charges on the surface as a result of mechanical stress applied to them.

Thanks to this property it is possible to manufacture systems able to exploit mechanical stresses, produced for example by means of acoustic vibrations or mechanical noise, and convert them into electricity.

There are currently electronic systems for transduction, implementation or "energy harvesting" on the market which are based on piezoelectric materials. Usually the piezoelectric material used is PZT (titanium lead-zirconate).

PZT is a ceramic-like material which, during manufacture, acquires piezoelectric properties when subjected to poling. This process allows the alignment of the domains of the molecules of a material, usually randomly oriented, by applying a strong electric field that passes through the material. The poling is usually carried out at high temperatures (about 800° C.)

In recent years, the market demand for piezoelectric materials has expanded considerably thanks to the advent of new technologies such as, for example, "wearable electronics" for which the need to have power systems (energy harvesting, for example) that can be integrated into clothes or fabrics in general, while keeping their mechanical properties intact is becoming an indispensable requirement. Another sector in which the requests for piezoelectric materials have increased is the biomedical sector. Consider, for example, flexible micro-actuator systems for drug delivery and biological tissue engineering.

However, PZT contains lead, a highly toxic heavy metal and, due to its characteristics of rigidity and intrinsic fragility, cannot be used in these application areas.

A solution to this problem can be the use of organic piezoelectric materials. Organic piezoelectric materials are flexible, lightweight, inexpensive in terms of production and easily creatable on a large scale.

Some of the best known organic piezoelectric materials are organic piezoelectric polymers. This category includes PVDF (polyvinylidene fluoride), and the copolymers of vinylidene fluoride, such as P(VDF-TrFe) (copolymer of vinylidene fluoride/trifluoroethylene) and P(VDF-TrFe-CFe) (copolymer of vinylidene fluoride/trifluoroethylene/1, 1-clorofluoroethylene).

In addition to flexibility, one of the main differences of piezoelectric polymers with respect to their inorganic counterpart lies in the acquisition of piezoelectric properties during the crystallization phase, from the amorphous phase (intrinsic phase) to the beta crystalline phase, and not through a poling process.

By definition, the piezoelectric properties of a material are associated with its crystalline phase. The dipole moments of polymers during crystallization tend, contrary to inorganic piezoelectric materials, to orient themselves on a plane perpendicular to the direction of the main axis of the polymer molecule.

However, the organic piezoelectric polymers of VDF have the disadvantage of not being biodegradable. This aspect limits the use possibilities of these polymers, and biological and eco-sustainable applications are in fact excluded.

For this type of applications it is therefore necessary to use organic polymers with piezoelectric properties and, at the same time, biocompatibility and biodegradability.

Polyhydroxyalkanoates (PHA) are organic polymers produced by microorganisms isolated from natural environments or even from genetically modified microorganisms, and are characterized by a high biodegradability and biocompatibility. However, PHAs do not have a high intrinsic piezoelectric response.

The Applicant has therefore posed the problem of developing a piezoelectric device that comprises an organic polymer with good piezoelectric properties and that is also biocompatible and biodegradable.

SUMMARY

The Applicant has now found that this problem, and others that will be better illustrated hereafter, can be solved by means of a piezoelectric device comprising a membrane comprising fibres of a polyhydroxyalkanoate (PHA) and at least one oxide having piezoelectric properties, preferably in the form of nanoparticles.

In a first aspect, the present disclosure therefore relates to a piezoelectric device comprising a membrane comprising fibres of a polyhydroxyalkanoate (PHA), having an average diameter comprised between 100 nm and 2000 nm, and at least one oxide having piezoelectric properties in a subdivided form having at least one average size comprised between 1 nm and 100 nm. Preferably the average diameter of the PHA fibres is comprised between 200 nm and 1000 nm.

Preferably, the PHA according to the present disclosure is a polymer containing repeating units of formula (I):

$$—O—CHR_1—(CH_2)_n—CO— \qquad (I)$$

where:
- $R_1$ is selected from: $C_1$-$C_{12}$ alkyls, $C_4$-$C_{16}$ cycloalkyls, $C_2$-$C_{12}$ alkenyls, optionally substituted with at least one group selected from: halogen (F, Cl, Br), —CN, —OH, —OOH, —OR, —COOR (R=$C_1$-$C_4$ alkyl, benzyl);
- n is zero or is an integer from 1 to 6, preferably is 1 or 2.

Preferably, $R_1$ is methyl or ethyl, and n is 1 or 2.

The PHAs can either be homopolymers, copolymers or terpolymers. In the case of copolymers or terpolymers, they can comprise different repeating units of formula (I), or of at least one repetitive unit of formula (I) in combination with at least one repetitive unit deriving from comonomers that are able to copolymerize with hydroxyalkanoates, such as lactones or lactams. In the latter case, the repeating units of formula (I) are present in an amount equal to at least 10% in moles with respect to the total moles of repetitive units.

Particularly preferred repeating units of formula (I) are those deriving from: 3-hydroxybutyrate, 3-hydroxyvalerate, 3-hydroxyhexanoate, 3-hydroxyoctanoate, 3-hydroxyundec-10-enoate, 4-hydroxyvalerate.

Particularly preferred PHAs are: polyhydroxybutyrate (PHB), poly-3-hydroxyvalerate (PHV), poly-3-hydroxyhexanoate (PHH), poly-3-hydroxyoctanoate (PHO), poly(3-hydroxybutyrate-co-3-hydroxyvalerate) (PHBV), poly(3-hydroxybutyrate-co-3-hydroxyhexanoate) (PHBH), poly(3-hydroxybutyrate-co-4-hydroxybutyrate), poly(3-hydroxyoctanoate-co-3-hydroxyundecen-10-enoate) (PHOU), poly(3-hydroxybutyrate-co-3-hydroxyvalerate-4-hydroxyvalerate) (PHBVV), polyhydroxybutyrate-hydroxyvalerate copolymer, or mixtures thereof.

According to the purposes of the present disclosure, a particularly preferred PHA is polyhydroxybutyrate (PHB).

Preferably the PHA fibres are produced by electrospinning. In fact, the electrospinning makes it possible to improve the piezoelectric properties of the PHA. The Applicant believes that this improved effect is due to the conformation that the molecules of PHA assume following the electrospinning process.

In the context of the present description and the attached claims, with "electrospinning" is intended a spinning method, known in the art, which exploits the interaction that is created between a polymeric solution and an external electric field. Electrospinning makes it possible to produce fibres with a diameter of nanometric or sub-micrometric dimensions, generally of the order of microns or tens of microns, with high speed and accurate process control, a result that is hardly achievable with the common techniques of fibre production through extrusion spinning.

An electrospinning system mainly comprises a pump for syringes connected to a syringe containing the polymeric solution, a spinneret connected to the syringe, a high voltage electrostatic field generator and a collector. Thanks to the action of the pump, the polymer solution is made to flow in the direction of the collector, passing through the spinneret, with a constant and controllable flow, while a high electrical potential (usually between 1 and 30 kV) is applied between the spinneret and the collector, and a drop of polymer is generated at the tip of the spinneret. As the difference in potential increases, the drop is subjected to increasing repulsive forces between its surface charges and the electrostatic forces exerted by the external electric field, until the distortion of the drop itself with the formation of a cone commonly known as Taylor's cone. As soon as the electric field exceeds a critical value, specific for each polymeric solution, the electrostatic forces prevail over the surface tension, leading to the formation of a polymer fibre.

Preferably the oxide having piezoelectric properties is electrospun together with the PHA. Alternatively, the oxide is dispersed within the already-formed membrane.

The PHA fibres are preferably oriented along the direction of rotation of the collector. In fact, advantageously during the electrospinning process, thanks to the presence of the strong external electric field, the polymeric chains tend to "stretch", initially depositing on the collector in a spiral pattern and subsequently orientating and further stretching as a result of the rotation speed of the collector. The resulting polymer fibres have a high percentage of amorphous phase. Following evaporation of the solvent under constant temperature conditions, the crystallization phenomenon occurs, wherein the fibres pass from an amorphous state to a polymorphous one (presence of alpha phase and beta phase).

Advantageously, the electrospinning therefore makes it possible to obtain a PHA filament comprising the beta crystalline phase, which is the phase responsible for the piezoelectric properties. The Applicant therefore considers that the electrospinning confers an improvement of the piezoelectric properties of the PHA according to the present disclosure.

Preferably, the oxide with piezoelectric properties according to the present disclosure is selected from: barium titanate ($BaTiO_3$), zinc oxide (ZnO), aluminium nitride (AlN), gallium nitride (GaN), cadmium sulfide (CdS). These oxides are used in a subdivided form, preferably in the form of spherical nanoparticles, nanowires, nanotubes, nanobelts or nanorods.

Preferably, the oxide is present in a concentration comprised between 1% and 30% by weight, more preferably between 2% and 15% by weight, the % being expressed with respect to the overall weight of the membrane.

To make the oxide more compatible with the PHA and the solvents used for electrospinning, the oxide preferably has at least one binding agent on the surface. Preferably the binding agent is present in a concentration comprised between 10% and 30%, the % being expressed with respect to the total weight of the oxide bound to the binding agent.

Preferably the binding agent is a hydrophilic binder or a lipophilic binder. The hydrophilic binding agent is preferably selected from: hydrocaffeic acid, polyethylene glycol derivatives, amino acids, proteins, vitamins, carbohydrates and lignin derivatives. The lipophilic binding agent is preferably selected from: N-(3,4-dihydroxyphenethyl)dodecanamide, hydroxamic acids, amides, acetates, carboxylic acids with aliphatic chains with a number of atoms of carbon comprised between 6 and 16.

Advantageously, the choice of the type of binding agent gives different characteristics to the oxide, making it suitable for use in various means, both hydrophilic and lipophilic.

Preferably, in fact, the binding agent molecules, coating the external surface of the oxide by means of supramolecular interactions, are organized in a densely packed layer called a self-assembled monolayer (SAM). The formation of the SAM is a convenient, rapid and versatile method through which the oxide properties can be modified.

Analyses carried out by the Applicant have surprisingly shown that the piezoelectric device according to the disclosure has particularly evident piezoelectric properties, in particular as regards the peak-to-peak voltage values, as better illustrated in the examples below.

These analyses have in fact shown that in the membrane according to the present disclosure, a considerable accumulation of electric charge is obtained thanks to the intrinsic piezoelectric properties of the additive and to the capacity of the additive to promote the formation of the beta phase of the PHA, the phase responsible for the piezoelectric properties of the polymer.

To evaluate the piezoelectric properties of the device according to the present disclosure, the same physical-mathematical model developed for piezoelectric crystals was used, using the method illustrated in detail in the examples given below.

According to a further aspect, the present disclosure also relates to a method for producing a piezoelectric device according to that which has been described above, which comprises:

- solubilizing a polyhydroxyalkanoate (PHA) in an organic solvent and dispersing in the solution thus obtained at least one oxide having piezoelectric properties in a subdivided form having at least an average size comprised between 1 nm and 100 nm, such to prepare a spinning solution;
- subjecting the spinning solution to an electrospinning process by means of a spinneret and a rotating support placed substantially perpendicular to the spinning direction, so as to obtain a membrane.

The electrospinning of the spinning solution produces fibres which are deposited on the rotating collector, so as to obtain the membrane according to the present disclosure. Preferably, the membrane has a flat configuration.

Advantageously, the electrospinning makes it possible to obtain PHA fibres preferably having an average diameter comprised between 100 nm and 2000 nm. Preferably the oxide having piezoelectric properties used according to the methods of the present disclosure, has at least one binding agent on the surface, as described above. The organic solvent used to prepare the spinning solution is a solvent which can solubilize the PHA, and is preferably selected from: 1,1,1,3,3,3-hexafluoro-2-propanol (HFIP), formic acid, chloroform, N,N-dimethylformamide (DMF) or mixtures thereof.

In the spinning solution, the PHA preferably has a concentration comprised between 1% and 20% p/v, more preferably between 2 and 10% p/v.

The oxide having piezoelectric properties is preferably present in the spinning solution in a concentration comprised between 0.05% and 15% p/v, more preferably between 0.1% and 10% p/v.

According to a further aspect, the present disclosure relates to the use of the piezoelectric device, as described above, in piezoelectric energy transducers (energy harvesting).

In fact, the piezoelectric device according to the present disclosure can advantageously be used in biological systems, for example in flexible micro-actuator systems for drug delivery and in the engineering of biological tissues (such as, for example, in pacemaker devices).

DETAILED DESCRIPTION OF THE DISCLOSURE

The following embodiment examples are provided for the sole purpose of illustrating the present disclosure and are not to be understood in a sense limiting the scope of protection defined by the appended claims.

Example 1 a) Functionalization of $BaTiO_3$ with Hydrocaffeic Acid.

0.577 g of $BaTiO_3$ was dispersed in 50 ml of absolute ethanol in a 250 ml beaker. The suspension was sonicated for 1 minute. 0.860 g of hydrocaffeic acid was added to the suspension, which was sonicated again for 1 minute. The suspension thus obtained was poured into a round-bottomed flask and stirred overnight at 60° C. Subsequently the suspension was purified by repeated centrifugation (15 min at 6000 rpm) and washes with a solution of water and ethanol (1:1), until a colourless supernatant was obtained.

b) Preparation of the Spinning Solution.

The purified PHB with 99.5% purity was dissolved in HFIP (1,1,1,3,3,3-hexafluoro-2-propanol) so as to obtain a spinning solution with a concentration of PHB equal to 4% p/v. The suspension of $BaTiO_3$ functionalized as described above was added to this solution. The solution was stirred on a plate at 800 rpm at room temperature, until complete dissolution of the polymer.

Subsequently, the solution was cooled, poured into a 10 mL plastic syringe and placed inside the electrospinning system in order to be processed. The deposition of the fibres of PHB and $BaTiO_3$ bound to hydrocaffeic acid was carried out on a cylindrical support (spindle) in steel placed in rotation by an electric motor.

The following parameters were used for the electrospinning process:

- spinning solution: purified PHB dissolved in HFIP at 4% p/v;
- processed solution volume: 1 mL;
- flow rate of the solution: 8 mL/hour;
- translational speed of the spinneret along the spindle: 0 mm/s;
- distance between the tip of the spinneret and the spindle (gap): 30 cm;
- voltage applied to the electrodes: 10-30 kV;
- spindle rotation speed: 2100 rpm;
- diameter of the spinneret exit hole: 2.15 mm (AWG 12);
- spindle diameter: 15 cm;

FIG. 1 shows the image of the membrane, obtained by scanning electron microscopy (SEM).

Example 2 a) Functionalization of $BaTiO_3$ with N-(3,4-Dihydroxyphenethyl)Dodecanamide.

0.577 g of $BaTiO_3$ was dispersed in 50 ml of absolute ethanol in a 250 ml beaker. The suspension was sonicated for 1 minute. 1.15 g of N-(3,4-dihydroxyphenethyl)dodecanamide was added to the suspension, which was sonicated again for 1 minute. The suspension thus obtained was poured into a round-bottomed flask and stirred overnight at 60° C. Subsequently the suspension was purified by repeated centrifugation (15 min at 6000 rpm), double washes with ethanol and then with hexane until a colourless supernatant was obtained.

b) Preparation of the Spinning Solution.

The purified PHB and the $BaTiO_3$ functionalized as described above were dissolved in HFIP (1,1,1,3,3,3-hexafluoro-2-propanol) so as to obtain a spinning solution with a concentration of PHB equal to 4% p/v. The solution was stirred on a plate at 800 rpm at room temperature until the complete dissolution of the polymer.

Subsequently, the solution was cooled, poured into a 10 mL plastic syringe and placed inside the electrospinning system in order to be processed. The deposition of the PHB and $BaTiO_3$ fibres bound to N-(3,4-dihydroxyphenethyl) dodecanamide was carried out on a steel cylindrical support (spindle) placed in rotation by an electric motor.

The following parameters were used for the electrospinning process:
spinning solution: purified PHB dissolved in HFIP at 4% p/v;
processed solution volume: 1 mL;
flow rate of the solution: 8 mL/hour;
translational speed of the spinneret along the spindle: 0 mm/s;
distance between the tip of the spinneret and the spindle (gap): 30 cm;
voltage applied to the electrodes: 10-30 kV;
spindle rotation speed: 2100 rpm;
diameter of the spinneret exit hole: 2.15 mm (AWG 12);
spindle diameter: 15 cm;

Example 3—Comparative Example

The purified PHB was dissolved in HFIP (1,1,1,3,3,3-hexafluoro-2-propanol) so as to obtain a spinning solution with a concentration of 4% p/v. The solution was stirred on a plate at 800 rpm at room temperature, until complete dissolution of the polymer.

Subsequently, the solution was cooled, poured into a 10 mL plastic syringe and placed inside the electrospinning system in order to be processed. The deposition of the PHB fibres was carried out on a steel cylindrical support (spindle) placed in rotation by an electric motor.

The following parameters were used for the electrospinning process:
spinning solution: purified PHB dissolved in HFIP at 4% p/v;
processed solution volume: 1 mL;
flow rate of the solution: 8 mL/hour;
translational speed of the spinneret along the spindle: 0 mm/s;
distance between the tip of the spinneret and the spindle (gap): 30 cm;
voltage applied to the electrodes: 10-30 kV;
spindle rotation speed: 2100 rpm;
diameter of the spinneret exit hole: 2.15 mm (AWG 12);
spindle diameter: 15 cm;

Example 4

The purified PHB was dissolved in HFIP (1,1,1,3,3,3-hexafluoro-2-propanol) so as to obtain a spinning solution with a concentration of 4% p/v. The solution was stirred on a plate at 800 rpm at room temperature, until complete dissolution of the polymer. A solution of $BaTiO_3$ at 5% in 1 mL of HFIP was added to the solution.

Subsequently, the solution thus obtained was cooled, poured into a 10 mL plastic syringe and placed inside the electrospinning system in order to be processed. The deposition of the PHB fibres was carried out on a steel cylindrical support (spindle) placed in rotation by an electric motor.

The following parameters were used for the electrospinning process:
spinning solution: purified PHB dissolved in HFIP at 4% p/v;
processed solution volume: 1 mL;
flow rate of the solution: 8 mL/hour;
translational speed of the spinneret along the spindle: 0 mm/s;
distance between the tip of the spinneret and the spindle (gap): 30 cm;
voltage applied to the electrodes: 10-20 kV;
spindle rotation speed: 2100 rpm;
diameter of the spinneret exit hole: 2.15 mm (AWG 12);
spindle diameter: 15 cm;

Example 5: Measurement of Piezoelectric Properties

A sample of about 2 cm² of each of the membranes obtained in Examples 3 and 4 was inserted between two aluminium sheets. The electric contacts for the connection to the voltage measurement instrument (voltmeter) were made by connecting the two aluminium sheets to two electric copper wires, through conductive silver paste or conductive epoxy resin.

A thin film of polydimethylsiloxane (PDMS) was placed over each sample in order to avoid the sliding of the upper aluminium sheet.

The measurement of the piezoelectric property was carried out by applying, on the upper aluminium sheet of each sample, a dynamic force exerted by a piston of about 7 mm² in diameter and a frequency of about 1.5 Hz. This force was applied along a perpendicular direction with respect to the upper aluminium sheet.

Following the application of this force, the electric charges of opposite sign accumulated on the two surfaces of the membrane. These charges led to the formation of a corresponding flow of charges through the external circuit (aluminium sheets, electric contacts and voltmeter), thereby restoring the electrostatic balance.

In detail, the measurements were taken in "open circuit" mode, i.e. measuring the voltage generated by the sample when subjected to compression by the piston.

Table 1 shows the results of the above measurements.

TABLE 1

| | PHB (Example 3) | PHB/BaTiO$_3$ (Example 4) |
|---|---|---|
| $V_{pp}$ (V) | 2.7 | 3.2 |
| $V_{pp}$ Increment | | +18.5% |

The parameter "$V_{pp}$" is the measured peak-to-peak voltage value. While the "increment" is the percentage difference between the measured $V_{pp}$ parameters.

As can be seen in Table 1, the addition of $BaTiO_3$ to the PHB leads to an increase in the measured $V_{pp}$ parameter. This indicates a corresponding improvement of the piezoelectric properties. This improvement is confirmed by the "increment" parameter which shows an increase of about 18% in the measured peak-to-peak voltage value for the sample of Example 4, compared to the comparative sample of Example 3.

The invention claimed is:

1. A piezoelectric device comprising a membrane comprising fibres of a polyhydroxyalkanoate (PHA), having average diameter comprised between 100 nm and 2000 nm, and at least one oxide with piezoelectric properties in a subdivided form having at least one average size comprised between 1 nm and 100 nm;
   wherein the oxide has at least one binding agent on its surface;
   wherein the at least one binding agent is a hydrophilic binder, selected from: hydrocaffeic acid, polyethylene glycol derivatives, amino acids, proteins, vitamins, carbohydrates and lignin derivatives; or
   a lipophilic binder, selected from: N-(3,4-dihydroxyphenethyl) dodecanamide, hydroxamic acids, amides, acetates, carboxylic acids with aliphatic chains with a number of atoms of carbon comprised between 6 and 16.

2. The device according to claim 1, wherein the PHA is a polymer containing repeating units of formula (I):

$$—O—CHR_1—(CH_2)_n—CO— \qquad (I)$$

where:

$R_1$ is selected from: $C_1$-$C_{12}$ alkyls, $C_4$-$C_{16}$ cycloalkyls, $C_2$-$C_{12}$ alkenyls, optionally substituted with at least one group selected from: halogen (F, Cl, Br), —CN, —OH, —OOH, —OR, —COOR (R=$C_1$-$C_4$ alkyl, benzyl);

n is zero or is an integer from 1 to 6.

3. The device according to claim 2, wherein the PHA is a polyhydroxybutyrate (PHB).

4. The device according to claim 1, wherein the oxide is selected from: barium titanate ($BaTiO_3$), zinc oxide (ZnO), aluminium nitride (AlN), gallium nitride (GaN), cadmium sulfide (CdS), and is used in a subdivided form, preferably in the form of spherical nanoparticles, nanowires, nanotubes, nanobelts or nanorods.

5. The device according to claim 1, wherein the oxide is present in a concentration comprised between 1% and 30% by weight, the % being expressed with respect to the overall weight of the membrane.

6. The device according to claim 1, wherein the binding agent is present in a concentration comprised between 10% and 30%, the % being expressed with respect to the total weight of the oxide bound to the binding agent.

7. Use of the piezoelectric device according to claim 1 in piezoelectric energy transducers.

\* \* \* \* \*